United States Patent [19]

Yoshida et al.

[11] Patent Number: 5,043,219
[45] Date of Patent: Aug. 27, 1991

[54] COMPOSITE MATERIAL

[75] Inventors: Katsuhito Yoshida; Kazuwo Tsuji, both of Itami, Japan

[73] Assignee: Sumitomo Electric Industries, Ltd., Osaka, Japan

[21] Appl. No.: 467,542

[22] Filed: Jan. 19, 1990

[30] Foreign Application Priority Data

Jan. 20, 1989 [JP] Japan ................................. 1-9835

[51] Int. Cl.$^5$ ....................... B32B 33/00; B32B 9/00
[52] U.S. Cl. ...................... 428/408; 148/DIG. 113; 156/603; 156/610; 156/612; 156/613; 156/DIG. 86; 156/DIG. 99; 204/192.15; 427/38; 427/255.1; 428/698; 428/704
[58] Field of Search ................ 428/408, 698, 704; 156/603, 605, 610, 612, 613, DIG. 68, DIG. 86, DIG. 99; 437/81, 84; 148/DIG. 113; 427/38, 39, 255; 204/192.15

[56] References Cited

U.S. PATENT DOCUMENTS

| | | | |
|---|---|---|---|
| 4,143,544 | 3/1979 | DeVries et al. | 73/104 |
| 4,551,195 | 11/1985 | Iizuka et al. | 156/603 |
| 4,565,741 | 1/1986 | Morimoto et al. | 428/698 |
| 4,683,043 | 7/1987 | Melton et al. | 204/192.15 |
| 4,699,687 | 10/1987 | Yazu et al. | 156/DIG. 86 |
| 4,734,339 | 3/1988 | Schachner et al. | 428/699 |
| 4,816,291 | 3/1989 | Desphandey et al. | 427/38 |
| 4,875,967 | 10/1989 | Mishima et al. | 156/605 |
| 4,961,958 | 10/1990 | Desphandey et al. | 427/38 |
| 4,973,494 | 11/1990 | Yamazaki | 427/38 |

FOREIGN PATENT DOCUMENTS 61-106494  5/1986  Japan .
1236687  10/1986  Japan .
2077454   4/1987  Japan .

Primary Examiner—Ellis P. Robinson
Assistant Examiner—Archene Turner
Attorney, Agent, or Firm—Wenderoth, Lind & Ponack

[57] ABSTRACT

A composite material useful as a diode capable of operating at a high temperature, i.e., 500° to 600° C. or a semiconductor optical device capable of emitting ultraviolet rays is provided which comprises an electrically insulating single crystal diamond substrate and single crystal cubic boron nitride directly formed on one surface of the single crystal diamond in such a manner that the single crystal cubic boron nitride has the same plane index as the substrate.

6 Claims, 2 Drawing Sheets

COMPOSITE MATERIAL

BACKGROUND OF THE INVENTION

1. Field of the Invention

This invention relates to a composite material consisting of an insulating substrate of single crystal diamond and cubic boron nitride epitaxially grown thereon.

2. Description of the Prior Art

It is generally known that cubic boron nitride (hereinafter referred to as "cBN") has the largest band gap (6 to 7 eV) as a semiconductor material and both P type and N type semiconductor can be prepared therefrom by adding impurities. Thus, it has eagerly been desired to develop the cBN semiconductors for the device operated at a high temperature or ultraviolet semiconductor laser device.

When a crystal is grown, in general, the growing is carried out on a substrate and as a substrate for the growth of cBN single crystal, there has hitherto been used only cBN itself. However, cBN having such a size and quality as to be suitable for use as a substrate has not been obtained up to the present time. Therefore, a good single crystal substrate as a substitute for cBN itself is essential considering the above described application and development of cBN as a semiconductor material.

As a substrate material for the growth of cBN, diamond having a lattice mismatch with cBN of only about 1.3% and substantially equal thermal expansion coefficient has been taken into consideration and up to the present time, a hetero junction of diamond and cBN has been proposed, for example, by W. E. Picket, Phys. Rev. B. vol. 38, 1316, 1988.

However, no report has been made on the growth of cBN on diamond as a substrate There has been no such precedent as succeeding in the growth of cBN on the heterogeneous substrate. That is, when considering the application of cBN to semiconductor devices operated at high temperatures, semiconductor optical devices capable of emitting ultraviolet rays, etc., which have hitherto not been prepared, there arises a problem that there is no suitable substrate for the growth of cBN.

SUMMARY OF THE INVENTION

It is an object of the present invention to provide a composite material comprising cBN formed on a diamond substrate.

It is another object of the present invention to provide a composite material containing a P type or N type semiconductor of cBN single crystal.

These objects can be attained by a composite material comprising an electrically insulating single crystal diamond substrate and single crystal cBN directly formed on one surface of the single crystal diamond in such a manner that the single crystal cBN has the same plane index as the substrate.

BRIEF DESCRIPTION OF THE DRAWINGS

The accompanying drawings are to illustrate in detail the principle and merits of the present invention.

DETAILED DESCRIPTION OF THE INVENTION

Figure 1:
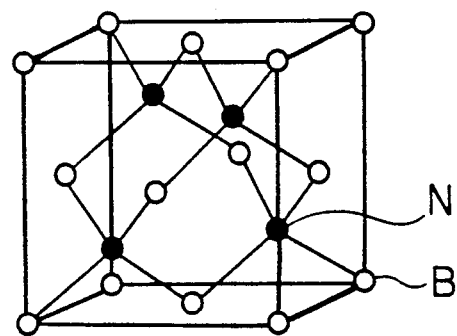
FIG. 1 is a schematic view of the crystal structure of cBN single crystal.

The inventors have made various studies and experiments for the growth of cBN using diamond considered most suitable as a substrate material for cBN so as to solve the above described problems and consequently, have found surprisingly that diamond can stably be existent even under the cBN-forming conditions by completely removing oxygen in an atmosphere in which cBN is formed on a diamond substrate. Based on this finding, the inventors have reached the composite material comprising cBN formed on diamond.

Accordingly, the present invention provides a composite material comprising an electrically insulating single crystal diamond substrate and single crystal cBN directly formed on one plane of the single crystal diamond in such a manner that the single crystal cBN has the same plane index as the substrate. In general, the cBN layer has a thickness of 10 to 100 $\mu$m and the diamond substrate has a thickness of 1 to 5 mm.

In particularly preferred embodiments of the present invention, there can be provided the above described composite materials wherein the substrate of single crystal diamond is of an artificial Ib type diamond single crystal and wherein the substrate of single crystal diamond is of an artificial IIa type diamond single crystal.

Furthermore there can be provided the above described composite material wherein the single crystal cBN is a P type or N type semiconductor.

In the composite material of the present invention, an electrically insulating diamond substrate for the growth of cBN is one having a resistivity of at least $10^4$ $\Omega$cm (25° C.). Such diamond includes, for example, natural or artificial diamonds of Ia type, Ib type and IIa type, each having an electric resistivity of $10^4$ to $10^{16}$ $\Omega$cm (25° C.). Almost all of natural diamonds are of Ia type, and diamonds synthesized artificially at an ultra-high pressure are usually of Ib type, but diamond of IIa type can be synthesized at an ultra-high pressure by adding a material to be nitrogen getter to the catalyst. In the present invention, therefore, artificial diamonds of Ib type and IIa type are particularly preferably used as a substrate.

The present invention includes also in the scope thereof a composite material wherein a cBN layer grown on a diamond substrate is of a P type or N type semiconductor. The P type semiconductor is, for example, obtained by doping the grown cBN layer with Be as an impurity and the N type semiconductor is, for example, obtained by doping the cBN layer with Si, S, Ge, Se, etc.

The composite material of the present invention can be prepared by completely removing oxygen in an atmosphere in which cBN is formed on a diamond substrate by the high temperature and high pressure method or by the CVD method. Specifically, there are used hexagonal boron nitride (hereinafter referred to as "hBN") as a raw material and a solvent material which is purified in high purity and which has a very small oxygen content, or there are used hBN and a solvent material each or both of which contain a low oxygen formation energy material such as Mg, Al, Ca, V, Ti, Zr and the like.

In the high temperature and high pressure method, the raw material usually contains 100 to 200 ppm of oxygen and in the CVD method, the raw material gas usually contains $10^{-7}$ to $10^{-6}$ torr.l/sec. In the present invention, on the contrary, the oxygen contents are generally reduced to 5 to 10 ppm and $10^{-8}$ to $10^{-9}$ torr.l/sec, respectively.

FIG. 1 is a schematic view of the crystal structure of cBN single crystal, in which N atoms are represented by . and B atoms are represented by o. As apparent from this FIGURE, cBN has the crystal structure of zincblende type, similar to diamond. The lattice constants of diamond and cBN are respectively 3.567 Å and 3.615 Å, corresponding to a lattice mismatch of about 1.3%. Since their thermal expansion coefficients are also close, i.e. respectively $4.50 \times 10^{-6}$ $K^{-1}$ (700° C.) and $4.30 \times 10^{-6}$ $K^{-1}$ (750° C.), it has not been considered impossible to grow cBN on a diamond substrate, but actually, this has not been realized. That is, cBN crystal could not be grown on a diamond substrate in the prior art under such a condition that the diamond substrate be stable.

The inventors have made various studies to know the cause that the diamond substrate cannot stably be present and consequently, have found that this is due to reaction of the diamond with oxygen in an atmosphere for the growth of cBN. Based on this finding, it can be confirmed that cBN can readily be grown on a diamond substrate if oxygen is completely removed from an atmosphere for the growth of cBN and the present invention is thus accomplished.

It is found by the reflection high energy electron ray diffraction (RHEED) or Raman spectrum that the cBN grown on an electrically insulating diamond substrate according to the present invention is single crystal cBN. When this cBN is doped with an additional element as an impurity, a semiconductor cBN with a diamond substrate can be obtained.

As illustrated above, according to the present invention, there can be provided a semiconductor cBN grown on an insulating substrate and making the best use of the property peculiar to cBN, i.e. wide band gap, a semiconductor device capable of operating at a high temperature and a semiconductor optical device capable of emitting ultraviolet rays can be realized.

The composite material of the present invention consists of cBN and a diamond substrate, which can be applied to a diode capable of operating at a high temperature, i.e. 500 to 600° C. or a semiconductor optical device capable of emitting ultraviolet rays by the best use of the excellent properties peculiar to cBN as a semiconductor, for example, wide band gap and thermal and chemical stability.

Furthermore, since in the composite material of the present invention, an electrically insulating diamond substrate there is no electric interaction between elements in an integrated circuit and high integration thereof is thus rendered easy, whereby very large scale integration can be realized by the joint use of the thermal property of the cBN semiconductor.

The following examples are given in order to illustrate the present invention in detail without limiting the same.

EXAMPLE 1

Figure 2:
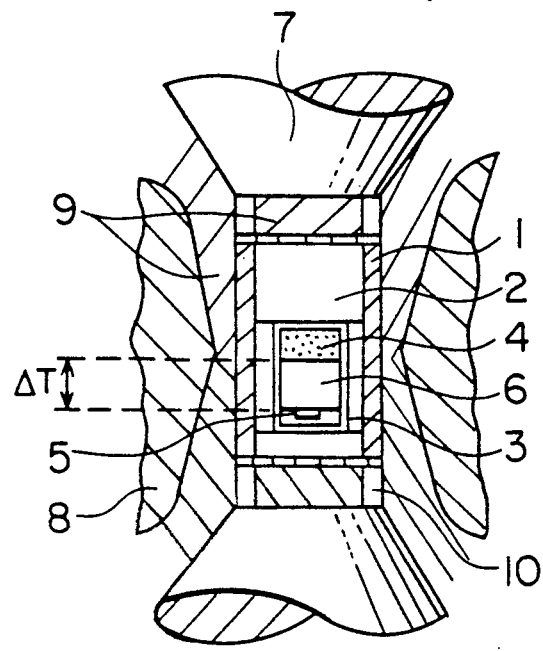
FIG. 2 is a cross-sectional view of an apparatus for the preparation of the composite material of the present invention, used in Examples 1 to 3.

Using a high temperature and pressure generating apparatus as shown in FIG. 2, the composite material of the present invention was produced by growing cBN on a diamond substrate. In this apparatus, a reaction chamber was surrounded by a molybdenum capsule 3 to prevent it from direct contact with a pressure medium 2 such as hBN and heated at a predetermined temperature by passing AC or DC current through a graphite heater 1. In the reaction chamber, a boron nitride source 4 was arranged so as to be at a higher temperature than a diamond substrate 5 and a solvent 6 such as $Li_3SrBN_2$ was arranged between the boron nitride source 4 and diamond substrate 5. The boron nitride was dissolved in the solvent 6 from the boron nitride source 4 at a high temperature and high pressure at which cBN was stable and precipitated on the substrate crystal 5 at the relatively lower temperature, based on the solubility difference of boron nitride due to the temperature difference. In FIG. 2, 7 designates an anvil, 8 designates a die, 9 designates a heat insulating pressure medium and 10 designates a power supply part.

$\Delta T$ means a temperature gradient between the boron nitride source 4 and diamond substrate 5.

The specific data of this experiment were as follows:

As the boron nitride source 4, there was used a compact of 4 mm in diameter and 2 mm in height, consisting of powdered hBN and cBN which had been subjected to a pretreatment for completely removing oxygen, and as the solvent 6, there was used a compact of 4 mm in diameter and 7 mm in height, consisting of $Li_3BrBN_2$.

The pretreatment for the removal of oxygen was carried out by heating and calcining the boron nitride source for 1 to 2 hours in high purity nitrogen at 2000 to 2100° C. to reduce the oxygen content to 10 ppm on less. As the substrate crystal 5, there was used a diamond single crystal of artificial Ib type with a maximum side of 3 mm, which was arranged in such a manner that its (1 1 1) plane was contacted with the solvent 6.

Figure 3:
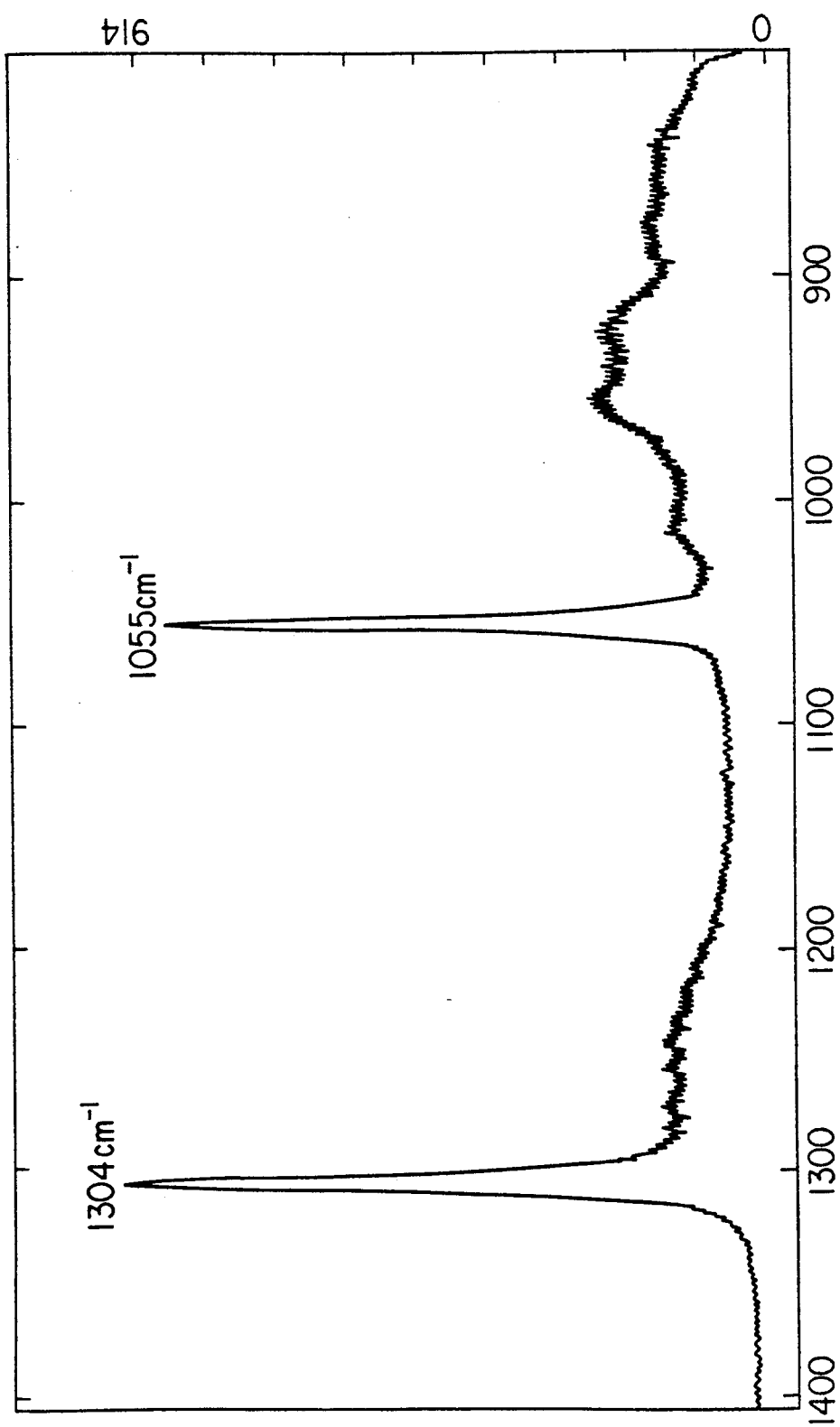
FIG. 3 is a Raman spectrum of cBN grown on a diamond substrate according to the present invention in Examples 1 to 3.

When growth of cBN was carried out at a pressure of 65 kb and a temperature of 1700° C. for a retention time of 2 hours using the above described reaction system, a yellow film with a thickness of about 100 μm was formed on the diamond substrate. Identification of this film by a Raman spectrum told that it consisted of cBN crystal having a peak near 1304 $cm^{-1}$ and 1055 $cm^{-}$ as shown in FIG. 3.

EXAMPLE 2 cBN was grown under the similar conditions to Example 1 but using artificial diamond of IIa type as a substrate instead of the artificial diamond of Ib type used in Example 1 and the boron nitride source further containing 4% by weight of Be powder. The thus resulting film was a blue film with a thickness of about 100 μm, having an electric resistance of about $10^3$ Ωcm and being electrically conductive.

EXAMPLE 3 cBN was grown under the similar conditions to Example 1 but using the boron nitride source 4 of Example 2, to which 5% by weight of silicon powder was further added. The thus resulting film was an orange film with a thickness of about 80 μm, having an electric resistance of about $10^4$ Ωcm and being electrically conductive.

EXAMPLE 4

Using the (1 1 1) plane of an artificial diamond single crystal as a substrate, a cBN film was grown by a vapor phase method wherein $B_2H_6$, $N_2$ and $H_2$ as raw material gases were fed to a reaction chamber respectively at flow rates of 10 cc/min, 10 cc/min and 100 cc/min and while adjusting the pressure inside the reaction chamber to 1 torr, and these gases were reacted for 4 hours at a DC plasma discharge output of 500 W, substrate temperature of 600° C. and tungsten filament temperature of 200° C. for preheating, and consequently, a film with a thickness of about 10 μm was deposited on the substrate surface. The raw material gas had an oxygen content corresponding to $10^{-9}$ torr.l/sec. Identification of the thus resulting film by a Raman spectrum told that it consisted of cBN having sharp peaks near 1304 cm$^{-1}$ and 1055 cm$^{-1}$.

What is claimed is:

1. A composite material comprising an electrically insulating single crystal diamond substrate and single crystal cBN directly formed on one surface of the single crystal diamond in such a manner that the single crystal cBN has the same plane index as the substrate.

2. The composite material as claimed in claim 1, wherein the single crystal diamond is that of artificial Ib type.

3. The composite material as claimed in claim 1, wherein the single crystal diamond is that of artificial IIa type.

4. The composite material as claimed in claim 1, wherein the single crystal cBN is a semiconductor of P-type or N-type.

5. The composite material as claimed in claim 4, wherein the semiconductor of P-type is cBN doped with Be as an impurity.

6. The composite material as claimed in claim 4, wherein the semiconductor of N-type is cBN doped with at least one member selected from the group consisting of Si, S, Ge and Se.

* * * * *